(12) United States Patent
Watanabe et al.

(10) Patent No.: US 6,927,979 B2
(45) Date of Patent: Aug. 9, 2005

(54) HEAT-EMITTING ELEMENT COOLING APPARATUS

(75) Inventors: Michinori Watanabe, Nagano (JP);
Toshiki Ogawara, Nagano (JP);
Haruhisa Maruyama, Nagano (JP);
Masayuki Iijima, Nagano (JP)

(73) Assignee: Sanyo Denki Co., Ltd., Tokyo (JP)

( * ) Notice: Subject to any disclaimer, the term of this patent is extended or adjusted under 35 U.S.C. 154(b) by 149 days.

(21) Appl. No.: 10/340,512

(22) Filed: Jan. 10, 2003

(65) Prior Publication Data

US 2004/0050536 A1 Mar. 18, 2004

(30) Foreign Application Priority Data

Sep. 12, 2002 (JP) ........................................ 2002-267092
Sep. 12, 2002 (JP) ........................................ 2002-267093

(51) Int. Cl.[7] .............................................. H05H 7/20
(52) U.S. Cl. ...................... 361/697; 165/80.3; 165/121; 165/185; 257/722; 361/703
(58) Field of Search ................ 165/80.2–80.3, 165/121–122, 185; 257/722; 415/175–178, 213.1; 361/687, 694–695, 697, 703, 715

(56) References Cited

U.S. PATENT DOCUMENTS

| | | | |
|---|---|---|---|
| 5,724,228 A | | 3/1998 | Lee |
| 5,794,685 A | * | 8/1998 | Dean .......................... 165/121 |
| 5,943,209 A | | 8/1999 | Liu |
| 6,023,413 A | * | 2/2000 | Umezawa ................... 361/697 |
| 6,137,680 A | | 10/2000 | Kodaira et al. |
| 6,301,110 B1 | | 10/2001 | Kodaira |

* cited by examiner

Primary Examiner—Gregory Thompson
(74) Attorney, Agent, or Firm—Rankin, Hill, Porter & Clark LLP

(57) ABSTRACT

A heat-emitting element cooling apparatus that can improve a cooling effect on a heat-emitting element without increasing its size is provided. A heat sink is so constructed that all or part of radiation fins are located outside the contour of a base as seen from a side on which an axial flow fan unit is mounted. Then, the axial flow fan unit is so constructed as to discharge air along the portions of the radiation fin located outside the contour of the base.

14 Claims, 11 Drawing Sheets

HEAT-EMITTING ELEMENT COOLING APPARATUS

BACKGROUND OF THE INVENTION

The present invention relates to a heat-emitting element cooling apparatus for cooling a heat-emitting element such as an electronic component.

Conventional heat-emitting element cooling apparatuses include a fan unit and a heat sink having a base and a plurality of radiation fins. In these apparatuses, a heat-emitting element to be cooled is mounted on the rear surface of the base, and the radiation fins are provided at the base. The fun unit is arranged or disposed on the heat sink, for blowing air along at least the radiation fins to promote heat dissipation from the radiation fins. In these heat-emitting element cooling apparatuses, heat generated from the heat-emitting element is transferred from the base to the radiation fins. Then, the air flowing from the fan unit along the radiation fins carries away the heat of the radiation fins, thereby cooling the heat-emitting element.

U.S. Pat. No. 6,137,680 and U.S. Pat. No. 5,724,228 disclose an electronic component cooling apparatus where a heat sink provided with a plurality of radiation fins arranged on a base, being parallel to each other, is cooled by a fan unit. In these apparatuses, an air flow space is defined or formed between a fan casing and the radiation fins of the heat sink. This space is open in the direction where the radiation fins extend.

U.S. Pat. No. 6,301,110 discloses an electronic component cooling apparatus in which a plurality of parting slits for interrupting continuity of a part of base and a plurality of radiation fins that extend in parallel to each other are provided.

U.S. Pat. No. 5,943,209 discloses an electronic component cooling apparatus provided with a plurality of radiation fins radially arranged on a base. In this apparatus, a fan casing has a skirt that surrounds a space formed above the radiation fins.

The publication of European Pat. Application No. EP0856888A2 discloses a cooling apparatus in which a plurality of slits are formed in the peripheral portion of a base having pin-type radiation fins so as to let wind fed from a fan unit pass below the base through the slits.

In recent years, with the higher performance of a heat-emitting element such as an electronic component, a larger amount of heat is generated from the heat-emitting element. Accordingly, there have been the demands for further enhancing cooling effect of the heat-emitting element cooling apparatus without increasing the size of the heat sink and also without increasing the weight of the apparatus.

SUMMARY OF THE INVENTION

It is therefore an object of the present invention to provide a heat-emitting element cooling apparatus that can further enhance cooling effect on a heat-emitting element without increasing the size of a heat sink of the cooling apparatus and also without increasing the weight of the apparatus.

It is another object of the present invention to provide a heat-emitting element cooling apparatus that has high cooling performance and also produces less noise.

A heat-emitting element cooling apparatus according to the present invention includes a heat sink and a fan unit. The heat sink has a base with a heat-emitting element to be cooled mounted on a rear surface thereof and a plurality of radiation fins provided at the base. The fan unit is arranged on the heat sink and blows air along at least the radiation fins to promote heat dissipation from the radiation fins. The heat sink is so constructed that all or part of the radiation fins are located outside the contour of the base as seen from a side where the fan unit is arranged or disposed. Further, the fan unit is so constructed as to blow the air along the portions of the radiation fins which are located outside the contour of the base.

When the radiation fins are provided at the base, heat dissipation is performed through the radiation fins and the base. However, the base becomes resistance against the air flow from the fan unit, and the existence of the base prevents the cooling performance from increasing. On contrast therewith, in the present invention wherein the radiation fins are so arranged that all or part of the radiation fins are located outside the base, the existence of the base will not become large resistance against the air flow. For this reason, according to the present invention, the cooling performance can be improved, compared with the case where the entire radiation fins are positioned on the base. This effect becomes more distinctive with an increase in the flow rate of air from the fan unit.

The fan unit includes a motor, an impeller having a plurality of blades for being driven for rotation by the motor, a fan casing having a cylindrical portion for rotatably receiving the impeller, and a plurality of webs arranged between the fan casing and the motor, for supporting the motor. The fan unit may be an axial flow fan unit so constructed as to blow the air onto the radiation fins. The impeller may include a blade mounting section provided at the rotor of the motor, for being driven for rotation and a plurality of blades provided at the cylindrical outer periphery of the blade mounting section. The fan casing may include an opposite wall located outside the cylindrical portion to face the heat sink, and a peripheral wall provided at the opposite wall and extending toward the base. When a space, through which the air discharged from the impeller passes, is provided between the opposite wall and the heat sink, it is preferable that the fan casing is so constructed as to prevent all or most of the air that has passed through the space from being directly discharged to the outside of the fan casing without passing through intervals between the radiation fins. With this arrangement, all or most of the air discharged from the impeller will flow through the intervals between the radiation fins. The flow rate of the cooling air that passes through the intervals of the radiation fins thus can be increased, thereby further improving the cooling effect for cooling the heat-emitting element.

Preferably, the fan casing is so formed that a thickness of the space between the opposite wall and the heat sink decreases with distance from the cylindrical portion. This arrangement can prevent the flow velocity of the cooling air that reaches the radiation fins located at a distance from the cylindrical portion from decreasing, thereby further improving the cooling effect. Further, this arrangement prevents a turbulent flow from being generated in the space, thereby reducing the noise produced from the apparatus.

The base of a columnar shape may be employed for the heat sink. In this case, the base is so arranged as to extend toward the fan unit in such a manner that the center of the fan unit is substantially aligned with the center of the base. Then, the radiation fins are so constructed as to be located outside the contour of the base as seen from a side where the fan unit is arranged. More specifically, the radiation fins extend from the outer periphery of the base in a radially outward direction of the base. The radiation fins may be directly or indirectly provided at the columnar base so that the radiation fins extend in the radial direction of the base and in the height direction of the base (in the direction from the fan unit toward the heat sink). With this arrangement, the cooling air from the fan unit flows along the outer peripheral surface of the base and the outer surface of the radiation fins.

Since the base does not exist under the radiation fins, the base does not become large resistance against the air flow. Heat from the heat-emitting element moves from the heat-emitting element toward the fan unit in the columnar base. For this reason, the heat from the base is transferred to the respective radiation fins from both the positions near the fan unit and the positions far away from the fan unit. Cooling performance thus can be improved more than with the conventional art.

In particular, the contour of the base as seen from the rear surface thereof is defined so as to be located inside the contour of the impeller, or preferably inside the outer periphery of the blade mounting section as seen from the rear surface side of the fan unit, or from the side of the heat sink. With this arrangement, the area on the radiation fins to be substantially cooled by the fan unit can be made as large as possible. As a result, the cooling performance of the cooling apparatus can be further improved.

The radiation fins constitute a radiation fin group. The radiation fin group may include two or more space-dividing radiation fins directly extending from the outer periphery of the base in the radial direction for dividing a space surrounding the outer periphery of the base into a plurality of divided spaces and a plurality of subdividing radiation fins located within the divided spaces. A part of the subdividing radiation fins respectively extend from two of the space-dividing radiation fins adjacent to each other so that the divided spaces are further subdivided, and the remaining subdividing radiation fins respectively extend outward from the outer periphery of the base arranged between adjacent two space-dividing radiation fins. With this arrangement, the overall surface area of the radiation fins can be increased more than in the case where the radiation fins are arranged radially with respect to the base. For this reason, the cooling performance of the apparatus can be improved.

Preferably, the subdividing radiation fins located in each of the divided spaces extend substantially in parallel to one another. With this arrangement, the number of the subdividing radiation fins can be made as large as possible.

It is also preferable that the subdividing radiation fins located in each of the divided spaces are inclined in a direction opposite to the rotational direction of the impeller. This arrangement can improve the cooling effect. The reason for this effect is not clear, but it may be considered that the cooling air strikes the fins efficiently.

Preferably, the shapes of the two or more space-dividing radiation fins are defined to allow sufficient heat dissipation through the subdividing radiation fins provided at the space-dividing radiation fins. Since the temperature of the space-dividing radiation fins decreases with distance from the columnar base, the thickness of the space-dividing radiation fins may be made thinner with distance from the base.

The respective tips of the two or more space-dividing radiation fins may be integrally provided with engaged sections to be engaged with the fan casing. Further, the fan casing may be integrally provided with two or more engagement pieces for engaging the engaged sections, and preferably, the fan unit is mounted on the heat sink by engagement of the engagement pieces with the engaged sections. With this arrangement, the fun unit can easily be positioned securely in place relative to the heat sink.

An example of such an engagement structure will be described below. First, two of the space-dividing radiation fins are arranged at two locations 180° mutually apart in the peripheral direction of the base. Further, another two of the space-dividing radiation fins are arranged at two different locations 180° mutually apart in the peripheral direction of the base. Then, the four space-dividing radiation fins are arranged so that an angle between two of the space-dividing radiation fins containing one of the divided spaces and an angle between another two of the space-dividing radiation fins containing another one of the divided spaces are equal. One of the divided spaces and another one of the divided spaces are radially opposed to each other. In addition, the respective tips of the four space-dividing radiation fins are integrally provided with four of the engaged sections to be engaged with the fan casing. Further, the fan casing is integrally provided with four engagement pieces for engaging the four engaged sections. Then, the fan unit is mounted on the heat sink by engagement of the four engagement pieces with the four engaged sections. Thus, using the four space-dividing radiation fins, the engagement structure enabling accurate positioning of the fan unit relative to the heat sink can be constructed easily.

In order to define and maintain a space between the opposite wall and the radiation fins, a plurality of spacer means may be arranged at the opposite wall.

Preferably, the base is formed of a material having a higher thermal conductivity than that of a material for the radiation fins. This allows the heat sink to be made light at low cost, and the thermal conductivity of the entire heat sink to be increased. In this case, the base may include a hollowed central section formed to be integral with the radiation fin group and including a cavity therein, and a high thermal conductor having a thermal conductivity higher than that of a material employed for forming the radiation fin group and the hollowed central section. The high thermal conductor is arranged within the cavity to allow heat transfer to the hollowed central section. The hollowed central section refers to a solid construction having a cavity therein. For example, it is a cylinder or a box. With this arrangement, heat can be efficiently transferred to the radiation fins through the base. In this case, the cavity may be constituted by a through hole that is open in both vertical directions. Then, the high thermal conductor may fully occupy 80–90% of a space extending from the bottom side opening to the top side opening of the through hole.

The base of the heat sink may be substantially rectangular in shape having a pair of first sides to be opposed to each other in the width direction of the base and a pair of second sides to be opposed to each other in the lateral direction of the base perpendicular to the width direction. In this case, the radiation fins may be provided at a front surface portion on the opposite side of the rear surface of the base. Further, the radiation fins may be arranged to be substantially perpendicular to the base and substantially in parallel to one another in the width direction, being spaced at predetermined intervals. In this case, the radiation fins may respectively include a pair of extensions located outside the pair of the second sides of the base. With this arrangement, most of air discharged from the fan unit can be directed downward through the radiation fins smoothly after being passed through intervals between adjacent radiation fins. Accordingly, the flow path resistance of air that flows along the radiation fins can be reduced, thereby improving the cooling performance of the apparatus. Further, when electronic components are arranged on the circuit board below the radiation fins, these electronic components can also be cooled.

Various methods can be employed for providing the radiation fins at the base. For example, a plurality of slits, which are mutually spaced in the width direction of the base and extends in the lateral direction of the base, may be formed in the front surface portion of the base, and the radiation fins may be provided at the front surface portion of the base by fitting of central edge portions of the radiation fins between the pair of extensions of the radiation fins into the slits. Thus, the radiation fins can be comparatively easily provided at the base.

When the above-mentioned heat sink is used, the fan casing may include an opposite wall located outside the cylindrical portion to face the heat sink, a pair of first side walls provided at the opposite wall and spaced from each other in the width direction of the base so that the radiation fins are located therebetween and a pair of second side walls provided at the opposite wall and spaced from each other in the lateral direction of the base so that the radiation fins are located therebetween. In this case, the pairs of first and second side walls may be so constructed as to prevent winds blown from the fan unit onto the radiation fins from being directly discharged to both sides in which the pairs of first and second side walls are positioned after passing through the space formed between the opposite wall and the heat sink. With this arrangement, even if the size of the heat sink has increased, all or most of air discharged from the impeller can easily pass through intervals between the radiation fins by forming the pairs of the first and second side walls.

It is preferable that a pair of step sections for forming engaged sections are formed in the pair of first sides of the base, one ore more engagement sections for engaging with the pair of engaged sections are formed to be integral with the tips of the pair of first side walls, and the engagement sections of the pair of first side walls are so constructed as to allow snap-in engagement with the pair of engaged sections. This arrangement allows easy positioning of the fun unit relative to the heat sink, thereby securely arranging the fan unit and the heat sink in place.

Preferably, the cylindrical portion is so constructed that part of the blades of the impeller are exposed as seen in the lateral direction and the width direction of the base. This arrangement can prevent the turbulent flow of the cooling air, thereby reducing the noise produced from the fan unit.

According to the present invention, the radiation fins are arranged in such a manner that all or part of the fins are located outside the base 207. Thus, the existence of the base does not become a greater obstacle to the flow of air. For this reason, the cooling performance of the heat-emitting element cooling apparatus can be improved more than in the case where the base receives the entire radiation fins. This cooling effect becomes more manifest with an increase in the flow rate of air from the fan unit.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Figure 1A:
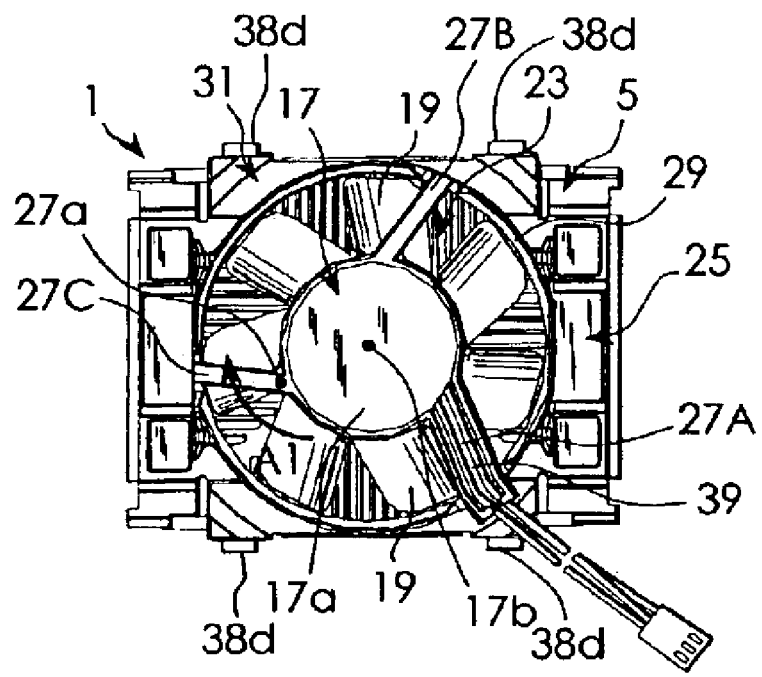
FIGS. 1(A), 1(B), 1(C), and 1(D) are a plan view, a right-side elevation view, a front elevation view, and a bottom view of a heat-emitting element cooling apparatus according to a first embodiment of the present invention, which is applied to an electronic component cooling apparatus.

FIGS. 1(A) to 1(D) illustrate a plan view, a right-side elevation view, a front elevation view and a bottom view of a heat-emitting element cooling apparatus according to the first embodiment of the present invention, which is applied to an electronic component cooling apparatus. FIG. 2 conceptually illustrates a sectional view of the electronic component cooling apparatus in FIG. 1. As shown in these drawings, an electronic cooling apparatus 1 in this embodiment includes a heat sink 3 and an axial flow fan unit 5. The heat sink 3 includes a base 7 and a radiation fin group 9 provided at the base 7, as shown in FIGS. 3(A) to 3(D) in detail. The base 7 is constituted by a cylindrical hollowed central section 7a including a cavity in its inside and a high thermal conductor 7b having a thermal conductivity higher than that of a material employed for forming the hollowed central section 7a. The high thermal conductor 7b is arranged within the cavity so that it can conduct heat to the hollowed central section 7a. The high thermal conductor 7b is formed of copper with a thermal conductivity higher than the thermal conductivity of the material (i.e. aluminum) for the radiation fin group 9 and the hollowed central section 7a, and has substantially a cylindrical shape. As illustrated in FIG. 2, the diameter of the base 7 (outer dimensions of the hollowed central section 7a) is equal to or less than the outer dimensions of an impeller 23 of the axial flow fan unit 5 described hereinafter. In this embodiment, the high thermal conductor 7b fully occupies 80–90% of a space that extends from the bottom to the top of the hollowed central section 7a. The radiation fin group 9 is provided at the outer periphery of the base 7. A heat-emitting element E constituted by an electronic component to be cooled is mounted on the rear surface of the base 7 or a bottom surface 7c opposite to the side where the axial flow fan unit 5 is located. This heat sink 3 is so constructed that all of radiation fins 13A to 13D and 15 of the radiation fin group 9 are located outside the contour of the base 7 or the hollowed central section 7a, as seen from a side where the axial flow fan unit 5 is mounted.

Figure 3A:
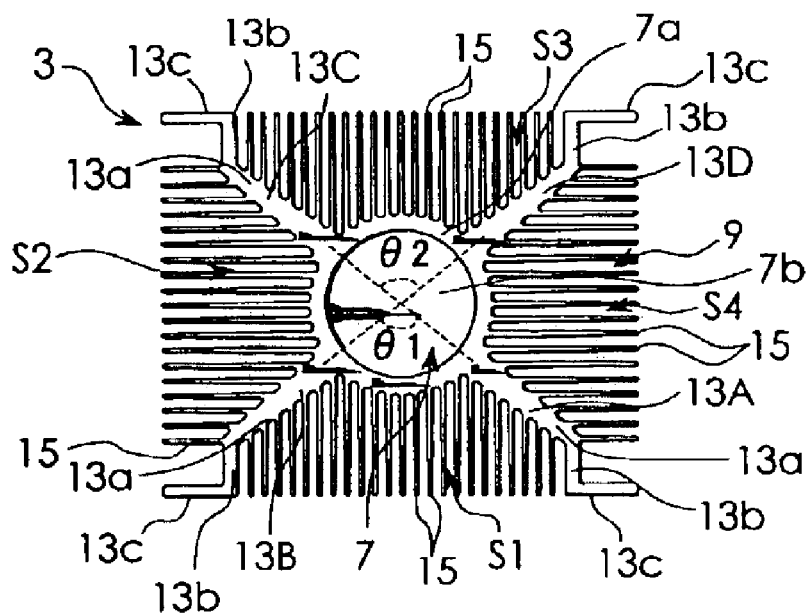
FIGS. 3(A), 3(B), 3(C), and 3(D) are a plan view, a right-side elevation view, a front elevation view, and a bottom view of a heat sink employed for the electronic component cooling apparatus illustrated in FIG. 1.
Figure 3B:
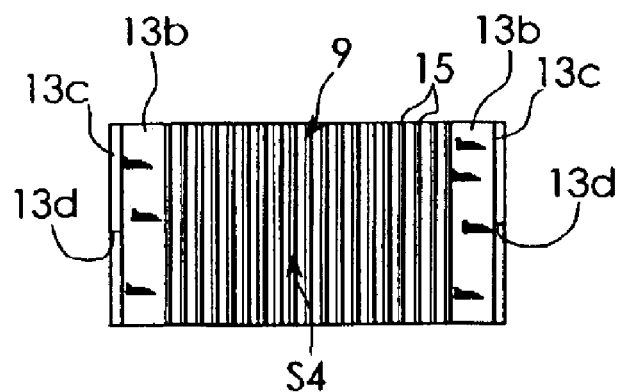
Figure 3C:
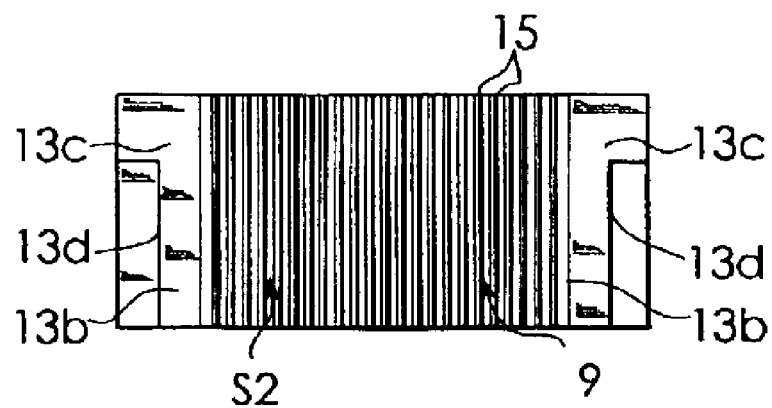
Figure 3D:
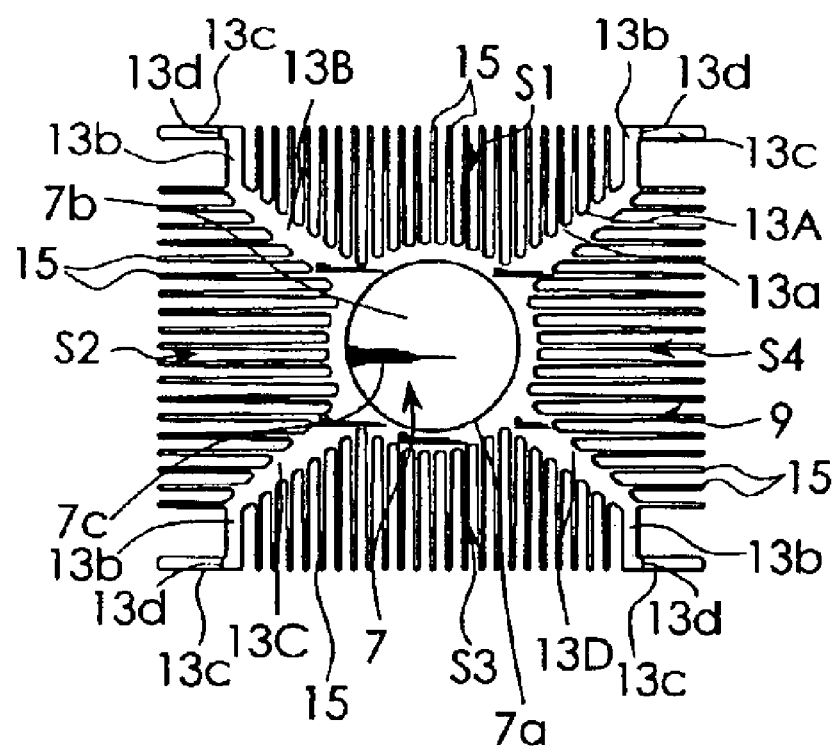
Figure 4A:
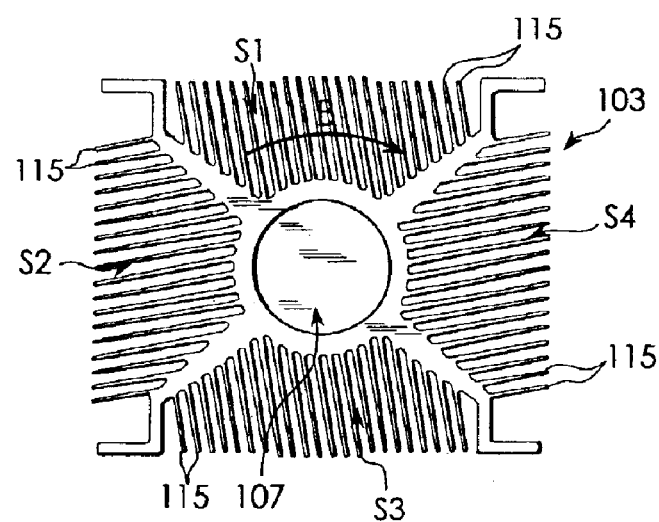
FIGS. 4(A), 4(B), 4(C), and 4(D) are a plan view, a right-side elevation view, a front elevation view, and a bottom view of a heat sink employed for a heat-emitting element cooling apparatus according to a second embodiment of the present invention.
Figure 4B:
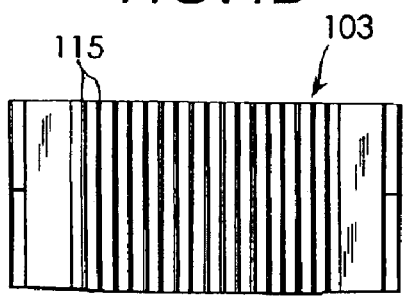
Figure 4C:
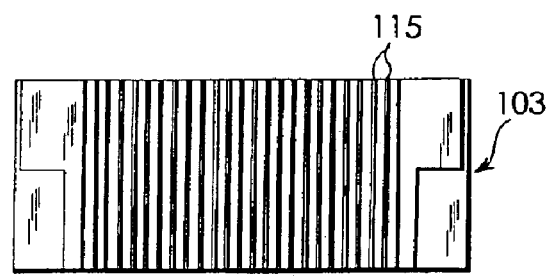
Figure 4D:
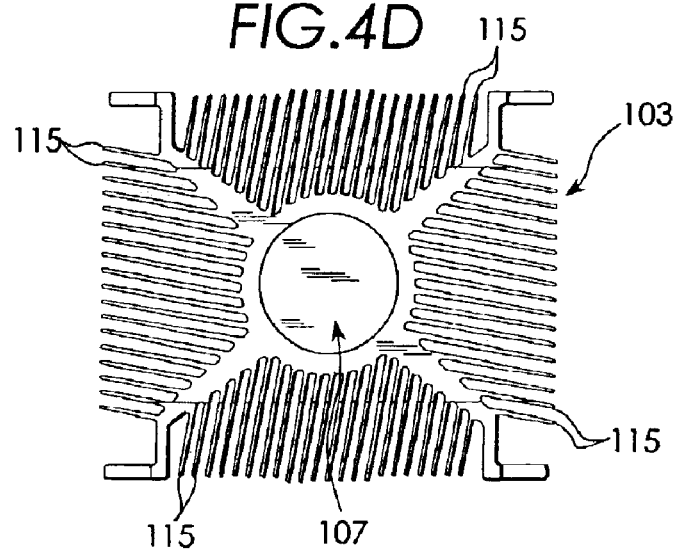

The radiation fin group 9 is constituted by four space-dividing radiation fins 13A to 13D integrally provided at the cylindrical hollowed central section 7a and a plurality of subdividing radiation fins 15 provided at the hollowed central section 7a and the space-dividing radiation fins 13A to 13D. The structure of the radiation fin group 9 will be described with reference to FIG. 1(D) and FIGS. 3(A) to 3(D). Each of the four space-dividing radiation fins 13A to 13D includes a plate-like fin main body 13a provided at the hollowed central section 7a, a first plate-like section 13b provided at the tip of the fin main body 13a, and a second plate-like section 13c provided at the tip of the first plate-like section 13b. The fin main body 13a has a shape of which the thickness or dimensions in the peripheral direction of the hollowed central section 7a gradually decreases from its base integrally provided at the hollowed central section 7a to its tip, or in the radially outward direction of the hollowed central section 7a. This shape is so defined that enough heat dissipation can be performed through the subdividing radiation fins 15. The first plate-like section 13b and the second plate-like section 13c are so arranged that the cross-section or the shape of them as seen from the rear surface of the heat sink 3 is of an L shape. The four space-dividing radiation fins 13A to 13D are so arranged that the second plate-like section 13c of the space-dividing radiation fin 13A is parallel to the second plate-like section 13c of the space-dividing radiation fin 13D, and that the second plate-like section 13c of the space-dividing radiation fin 13B is parallel to the second plate-like section 13c of the space-dividing radiation fin 13C. Notches 13d are formed in the four second plate-like sections 13c, as illustrated in FIG. 1(C), FIG. 3(C), and FIG. 3(D). These notches 13d constitute engaged sections to be engaged with engagement pieces 35 of a fan casing 25 described hereinafter.

The four space-dividing radiation fins 13A to 13D directly extend radially from the hollowed central section 7a and then divides a space surrounding the outer periphery of the base 7 into four divided spaces S1 to S4. More specifically, the two space-dividing radiation fins 13A and 13C are arranged at two locations mutually 180° apart in the peripheral direction of the base 7. Further, the two space-dividing radiation fins 13B and 13D are arranged at two different locations mutually 180° apart in the peripheral direction of the base 7. Then, the four space-dividing radiation fins 13A to 13D are arranged such that an angle θ1 between the two space-dividing radiation fins 13A and 13B that contain the divided space S1 and an angle θ2 between the two space-dividing radiation fins 13C and 13D that contain the divided space S3 become equal. The divided space S1 is radially opposed to the divided space S3 with respect to the base 7.

The subdividing radiation fins 15 are located within the divided spaces S1 to S4 for subdividing the divided spaces S1 to S4. A plurality of the subdividing radiation fins 15 located between two adjacent space-dividing radiation fins 13A and 13B, 13B and 13C, 13C and 13D, and 13D and 13A extend outward from respective two adjacent space-dividing radiation fins and the hollowed central section 7a located between the two adjacent space-dividing radiation fins. The subdividing radiation fins 15 located within each of the dividing spaces S1 to S4 extend outward in parallel to each other.

Figure 2:
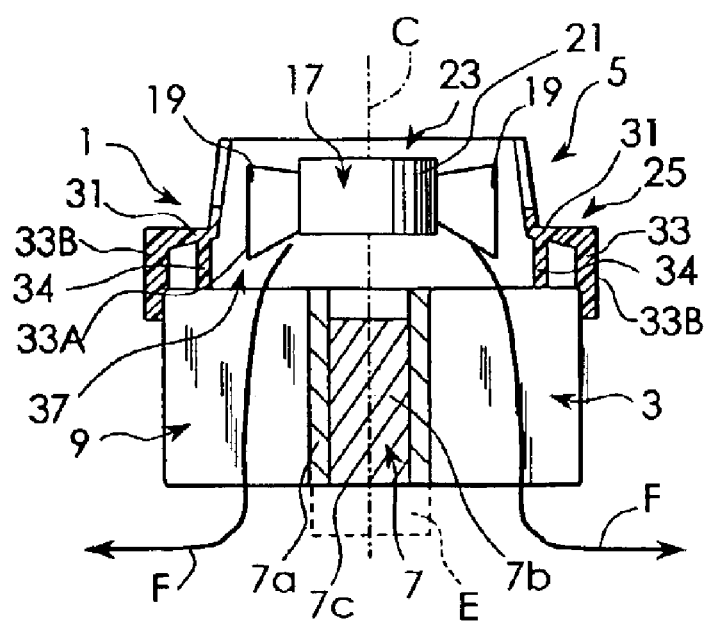
FIG. 2 is a diagram conceptually illustrating a vertical section of the electronic component cooling apparatus illustrated in FIG. 1.

As illustrated in FIG. 1(A), the axial flow fan unit 5 includes a motor 17, an impeller 23 having seven blades 19 and a cup-like blade mounting section 21 (illustrated in FIG. 2) for being driven for rotation by the motor 17, a fan casing 25, and three webs 27A to 27C. The axial flow fan unit 5 draws in air from the webs 27A to 27C, and operates to blow air toward the radiation fin group 9. In this embodiment, the fan casing 25, a housing 17a of the motor 17 and the webs 27A to 27C are integrally formed using a compound mainly made of a synthetic resin material.

As illustrated in FIG. 2, the blade mounting section 21 is provided at the rotor (not shown) of the motor 17 for being driven for rotation. The axial flow fan unit 5 is mounted on the heat sink 3 so that a rotation center C of the rotor is substantially aligned with a center C' of the base 7. In this embodiment, the outer dimensions of the base 7 or the hollowed central section 7a are smaller than the outer dimensions of the blade mounting section 21.

Figure 1B:
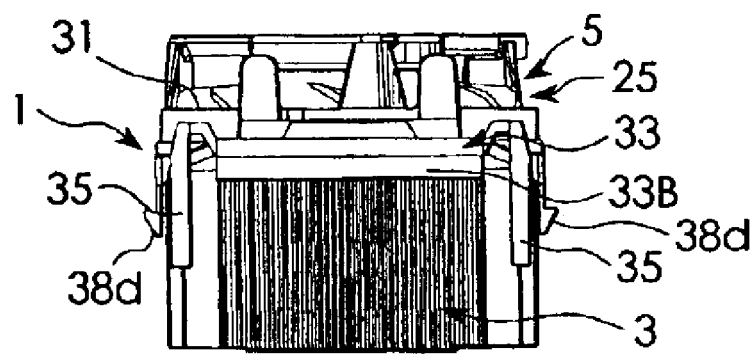
Figure 1C:
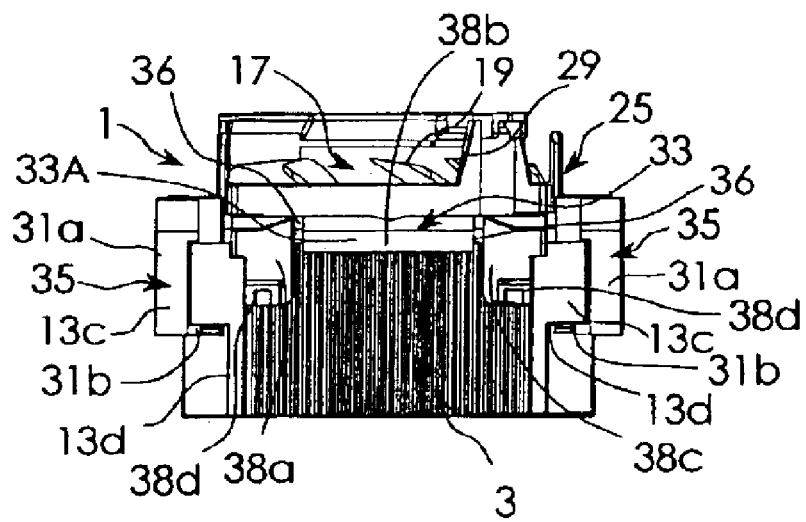

As illustrated in FIGS. 1(A) to 1(D) in detail, the fan casing 25 includes a cylindrical portion 29 for rotatably receiving the impeller 23, an opposite wall 31 located outside the cylindrical portion 29 to face the heat sink 3, a peripheral wall 33 provided at the opposite wall 31, which extends toward the base 7, and the four engagement pieces 35 provided at the opposite wall 31. As illustrated in FIGS. 1(B) and 1(C), the cylindrical portion 29 is so constructed that part of the blades 19 of the impeller 23 are exposed as seen from the width direction of the base 7 and the lateral direction perpendicular to the width direction of the base 7. Two spacer means 34 interposed between the opposite wall 31 and the radiation fin group 9, for forming and maintaining a space 37 are arranged under the opposite wall 31, as illustrated in FIG. 2. The number of the spacer means is arbitrary.

Figure 1D:
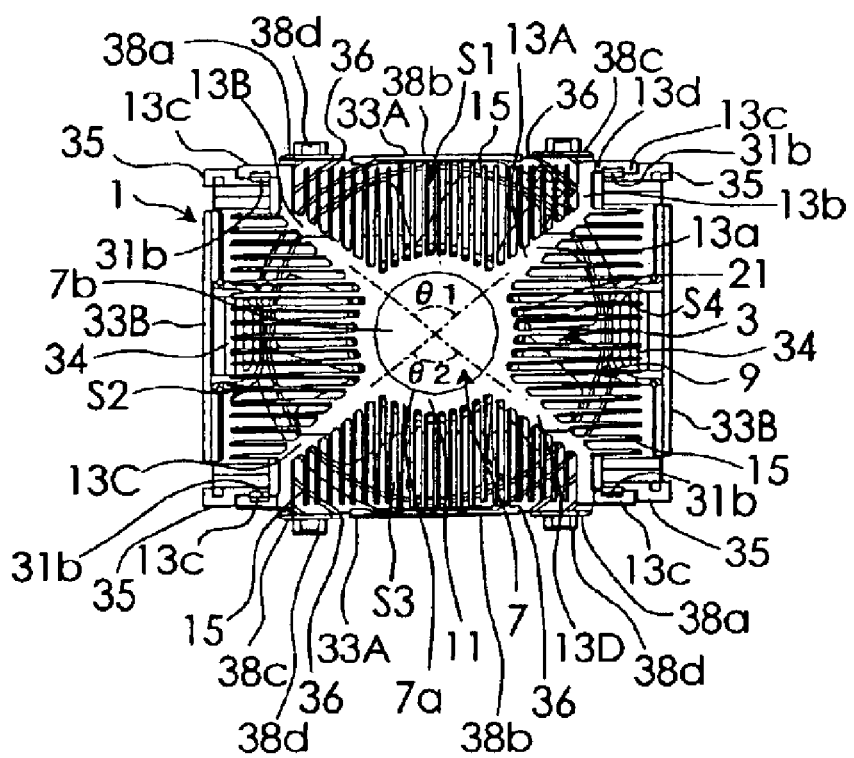

As illustrated in FIGS. 1(C) and 1(D), the peripheral wall 33 includes a pair of first side walls 33A facing part of the subdividing radiation fins 15 within the two divided spaces S1 and S3 described before in the lateral direction of the fan casing 25 and a pair of second side walls 33B facing the subdividing radiation fins 15 within the two divided spaces S2 and S4 in the lateral direction of the fan casing 25. Each of the pair of the first side walls 33A is constituted by three side wall portions 38a, 38b, and 38c divided by two slits 36. The two side wall portions 38a and 38c on both sides are provided with hooks 38d (illustrated in FIG. 1(B)) for engaging mounting hardware not shown. The slits 36 permit the side walls 38a and 38c to be inclined inward when the side walls 38a and 38c are subject to an external force. As illustrated in FIG. 2, the first side walls 33A and the second side walls 33B of the fan casing 25 enclose the space 37 between the opposite wall 31 and the heat sink 3. The air indicated by arrows F discharged from the impeller 23 passes through the space 37. This results in prevention of direct discharge of all or most of the air indicated by the arrows F, which has passed through the space 37, to outside the fan casing 25 without passing through intervals between the subdividing radiation fins 15.

As illustrated in FIG. 1(C), each of the four engagement pieces 35 includes a main body section 31a that extends from the opposite wall 31 to the heat sink 3 and an engagement projecting section 31b that projects toward the base 7 from the edge of the main body section 31a on the side of the heat sink 3. Part of the respective four engagement pieces 35 cause engagement projecting sections (or hooks) 31b therein to snap-in for engagement with the notches 13d in the second plate-like sections 13c at the tips of the space-dividing radiation fins 13A to 13D. In this manner, the axial flow fan unit 5 is detachably mounted on the heat sink 3.

As illustrated in FIG. 1(A), the webs 27A to 27C are arranged between the fan casing 25 and the motor 17, and then supports the motor 17. The web 27A, whish is one of the webs 27A to 27C, has a plurality of electrical wires 39 for supplying power to the motor 17 arranged therein. As seen in the web 27C in FIG. 1(A), each of the webs 27A to 27C includes a motor-side joint portion 27a joined with the housing 17a of the motor 17 and a cylindrical-portion-side joint portion 27b joined with the cylindrical portion 29. The webs 27A to 27C are arranged, being inclined with respect to the rotational direction of the impeller 23, as indicated by an arrow A1.

According to the heat-emitting element cooling apparatus in this embodiment, cooling air from the axial flow fan unit 5 flows along the outer peripheral surface of the base 7 and the outer surfaces of the radiation fins 13A to 13D and 15, which constitute the radiation fin group 9, as illustrated in FIG. 2. Since the base 7 does not exist outside the radiation fins located on the opposite side of the axial flow fan unit 5, the base 7 does not become a great obstacle to heat dissipation. Further, heat from the heat-emitting element E moves from the heat-emitting element E to the axial flow fan unit 5 along the columnar base 7. For this reason, the heat from the base 7 is transferred to the respective radiation fins from both the positions near the axial flow fan unit 5 and the positions far away from the axial flow fan unit 5. Cooling performance can be thereby improved considerably, compared with the conventional art. Further, in this embodiment, the first side walls 33A and the second side portions 33B are arranged so as to enclose the sides of the space 37. This prevents all or most of the air that has passed through the space 37 from being directly discharged to outside the fan casing 25 without passing through the intervals between the subdividing radiation fins 15. Accordingly, all or most of the air discharged from the impeller 23 passes through the intervals between the radiation fins of the radiation fin group 9. For this reason, the flow rate the cooling air that passes through the intervals between the radiation fins of the radiation fin group 9 can be increased, thereby further improving the cooling effect on the heat-emitting element E.

FIGS. 4(A) to 4(D) are a plan view, a right-side elevation view, a front elevation view, and a bottom view of a heat sink 103 employed for a heat-emitting element cooling apparatus according to a second embodiment of the present invention. The heat sink of the heat-emitting element cooling apparatus in this embodiment has the same structure as the heat sink illustrated in FIG. 3, except for subdividing radiation fins 115. Thus, descriptions of the elements will be omitted. Note that 100 should be added to the reference numerals of the elements in FIG. 3 other than the subdividing radiation fins 115. In this embodiment, a plurality of subdividing radiation fins 115 located within each of the divided spaces S1 to S4 are inclined in a direction opposite to the rotating direction of the impeller or the direction indicated by an arrow B. Use of a heat sink having such a structure can improve the cooling effect of the heat-emitting element cooling apparatus more than with the heat sink 3 illustrated in FIG. 3.

Figure 5A:
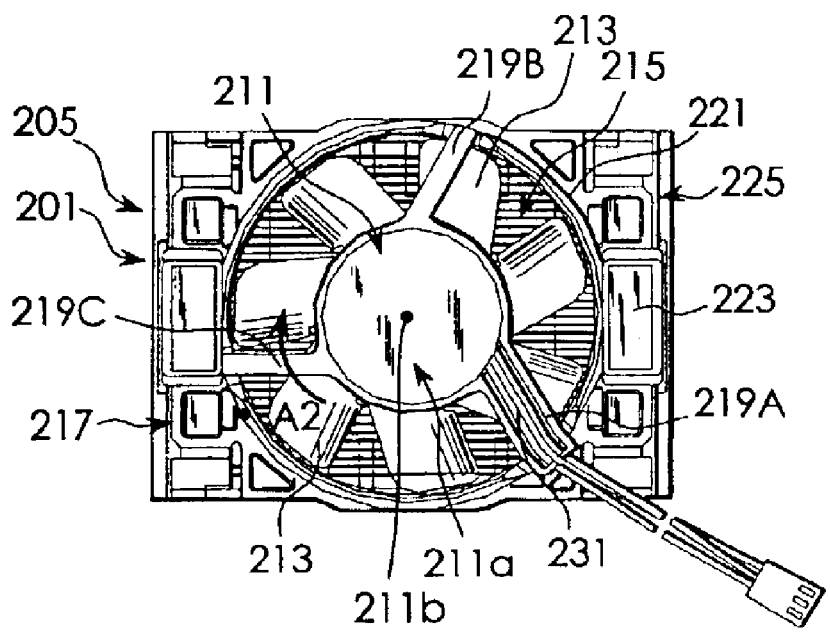
FIGS. 5(A), 5(B), 5(C), and 5(D) are a plan view, a right-side elevation view, a front elevation view, and a bottom view of a heat-emitting element cooling apparatus according to a third embodiment of the present invention, which is applied to an electronic component cooling apparatus.
Figure 5B:
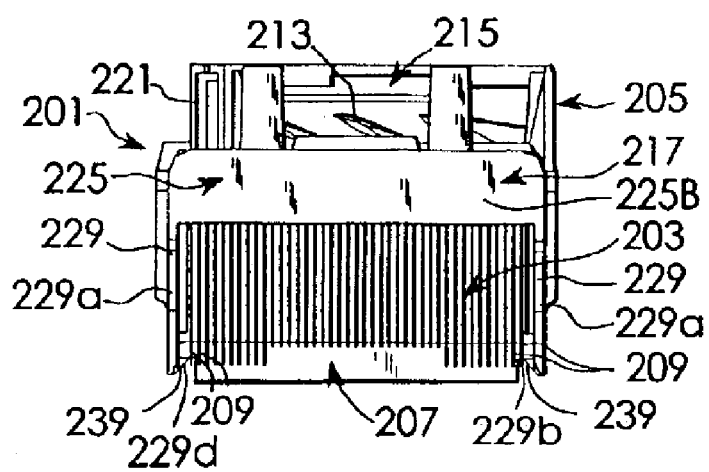
Figure 5C:
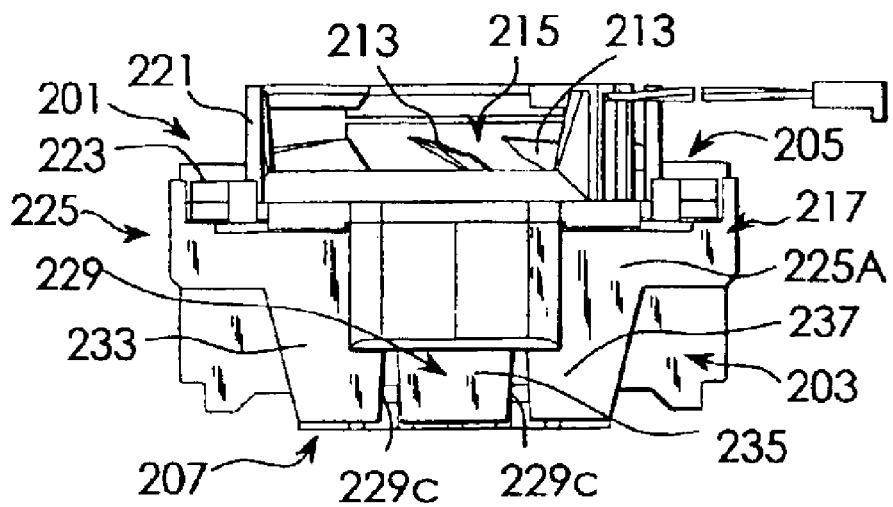
Figure 5D:
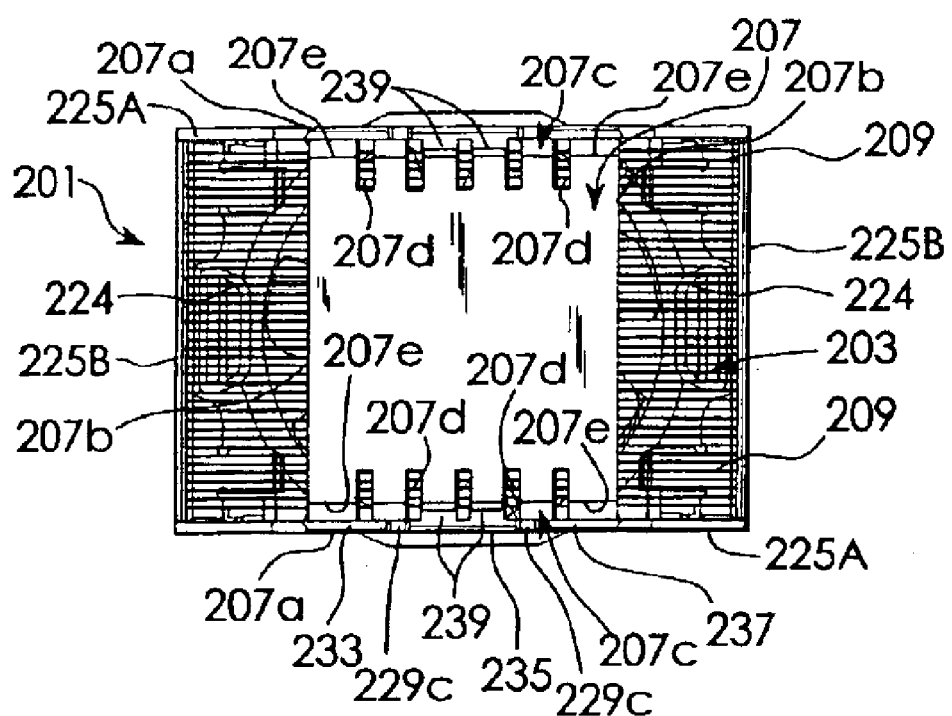
Figure 6:
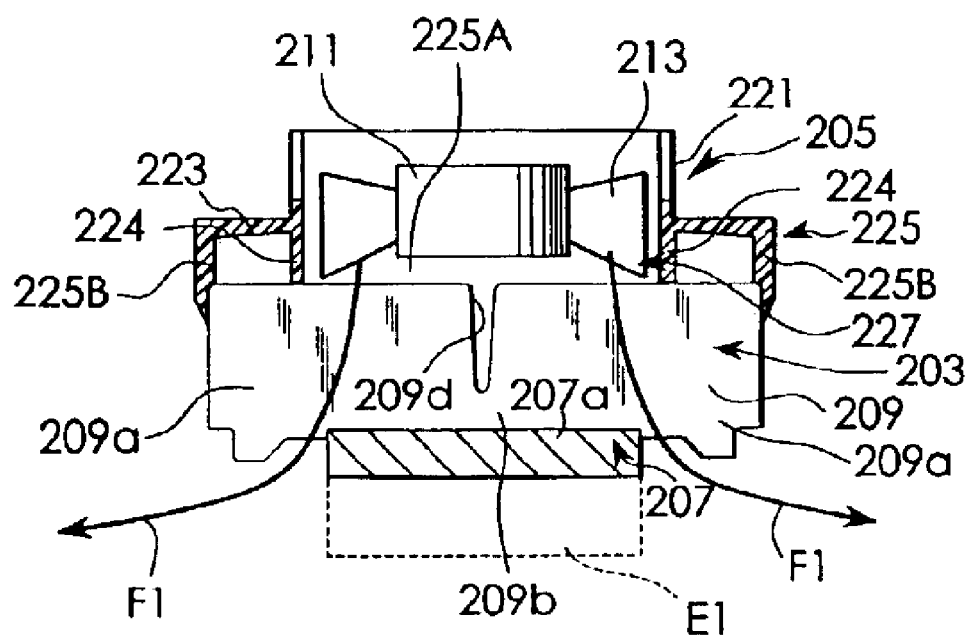
FIG. 6 is a diagram conceptually illustrating a vertical section of the electronic component cooling apparatus illustrated in FIG. 5.

FIGS. 5(A) to 5(D) are a plan view, a right-side elevation view, a front elevation view, and a bottom view of a heat-emitting element cooling apparatus according to a third embodiment of the present invention, which is applied to an electronic component cooling apparatus. FIG. 6 is a sectional view conceptually showing the electronic component cooling apparatus illustrated in FIG. 5. As illustrated in these drawings, an electronic component cooling apparatus 201 in this embodiment includes a heat sink 203 and an axial flow fan unit 205. As illustrated in FIGS. 7(A) to 7(D) in detail, the heat sink 203 includes a plate-like copper base 207 and a plurality of radiation fins 209 provided at the top surface of the base 207. The contour of the base 207, as seen from its top or rear surface, has substantially a rectangular shape. The base 207 has a pair of first sides 207a opposed to each other in the width direction of the base and a pair of second sides 207b opposed to each other in the lateral direction of the base perpendicular to the width direction. As illustrated in FIG. 6, on the rear surface of the base 207 is mounted a heat-emitting element E1 constituted by an electronic component to be cooled. A pair of step sections 207c are formed in the base 207 along the pair of the first sides 207a. Further, as illustrated in FIG. 5(D), five slits 207d are formed in each of the pair of the fist sides 207a. The slits 207d are open in the thickness and width directions of the base 207. With this arrangement, each of the step sections 207c is constituted by six divided step sections 207e. A pair of engagement sections 239 of the axial flow fan unit 205 described hereinafter and illustrated in FIG. 5(B) are respectively engaged with two step sections 207e located in the middle of the six step sections 207e.

Figure 7A:
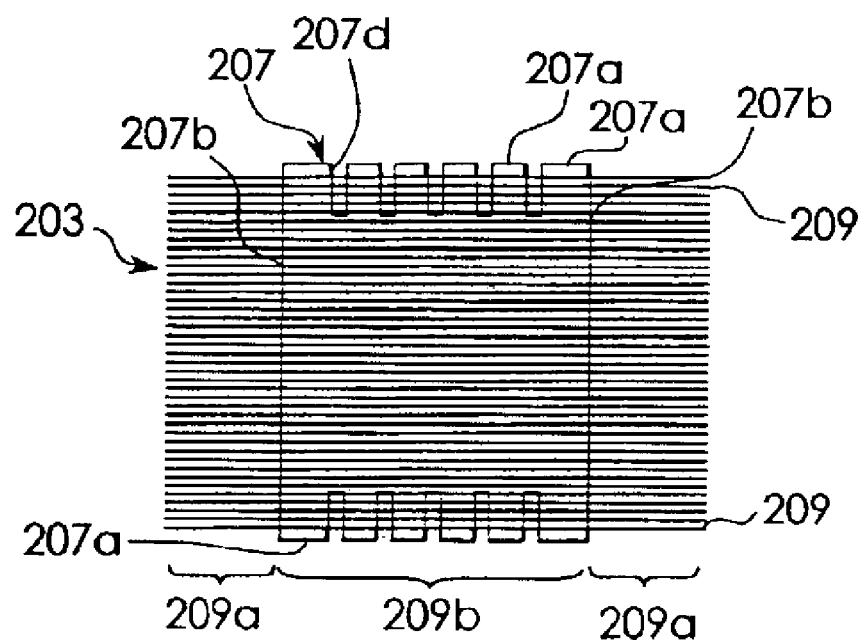
FIGS. 7(A), 7(B), 7(C), and 7(D) are a plan view, a right-side elevation view, a front elevation view, and a bottom view of a heat sink employed for the electronic component cooling apparatus illustrated in FIG. 5.
Figure 7B:
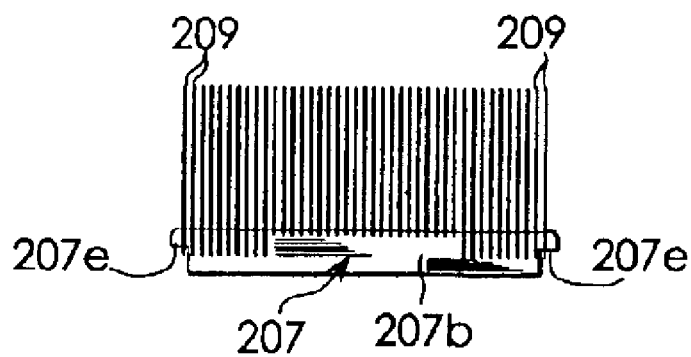
Figure 7C:
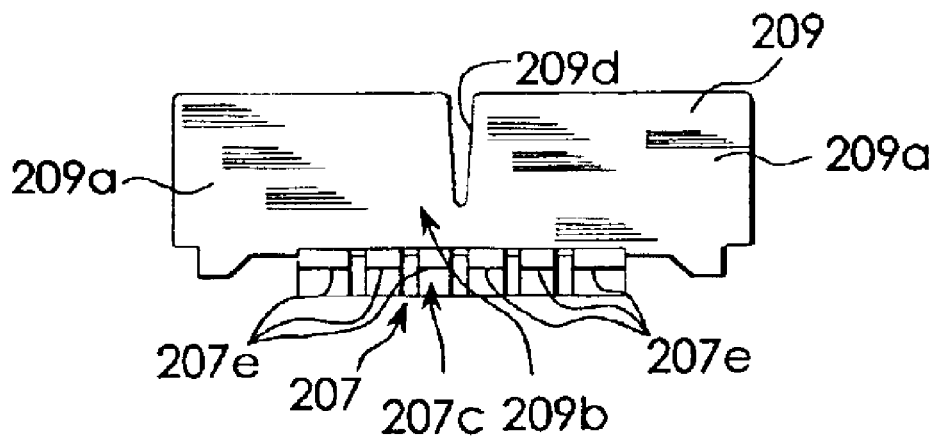
Figure 7D:
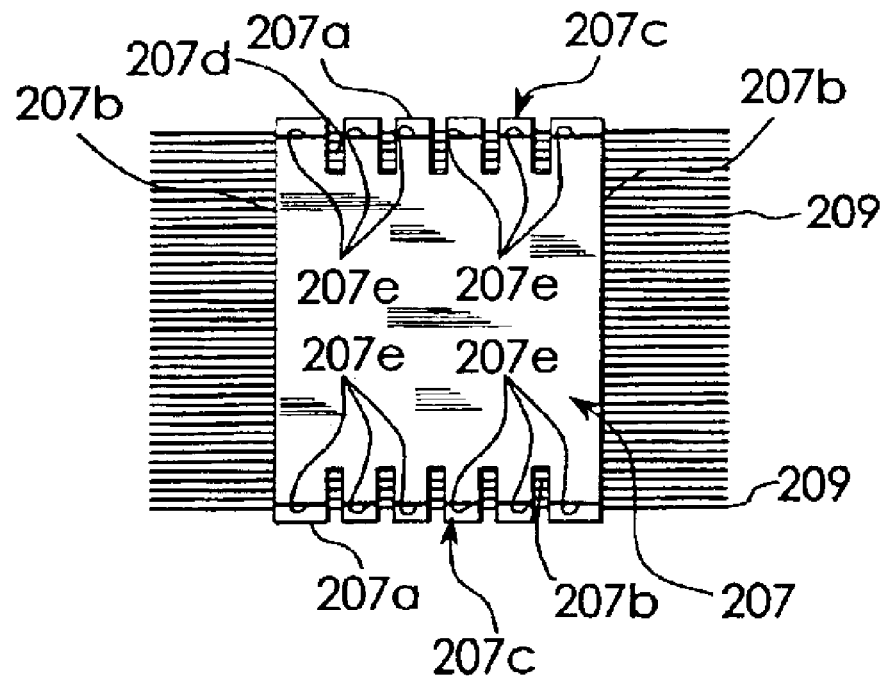

As illustrated in FIG. 7(C), the respective radiation fins 209 have V-shaped slits 209d substantially in their centers. The slits 209d are open in the thickness direction of the radiation fins 209 and toward the axial flow fan unit 205. The contour of the radiation fins 209 is of substantially a rectangular shape. The radiation fins arranged in the middle of the radiation fins 209 are formed of copper plates, while the other radiation fins are formed of aluminum plates. The radiation fins 209 are nearly perpendicular to the base 7 and are arranged in parallel to each other, being spaced at predetermined intervals in the width direction of the base 207. Then, the portions of the radiation fins 209 on both sides of the radiation fins 209 in the longitudinal direction thereof are located outside the base 207, as seen from the side where the fan unit 205 is mounted. In other words, as illustrated in FIG. 7(A), the radiation fins 209 respectively includes a pair of extensions 209a located outside the paired second sides 207b of the base 207 and a central portion 209b arranged between the pair of the extensions 209b. Then, the lower edges of the central portions 209b of the respective radiation fins are fitted into slits formed in the base 207, not shown, and welded into the base. In this manner, the radiation fins 209 are provided at the top surface of the base 207. In this embodiment, the ratio of the length of the extension 209a to the central portion 209b is approximately 5:13.

As illustrated in FIG. 5(A), the axial flow fan unit 205 includes a motor 211, an impeller 215 having seven blades 213 for being driven for rotation by the motor 211, a fan casing 217, and three webs 219A to 219C. The axial flow fan unit 205 operates to draw in air from the web 219A to 219C and then blow the air toward the radiation fins 209. In this embodiment, the fan casing 217, a housing 211a for the motor 211, and the webs 219A to 219C are integrally formed of a compound mainly made of a synthetic resin material.

The fan casing 217 includes a cylindrical portion 221 for rotatably receiving the impeller 215, an opposite wall 223 located outside the cylindrical portion 221 to face the heat sink 203, and a peripheral wall 225 provided at the opposite wall 223 and extending toward the base 207. As illustrated in FIGS. 5(B) and 5(C), the cylindrical portion 221 is so constructed that part of blades 213 of the impeller 215 are exposed, as seen from both of the width direction of the base 207 and the lateral direction of the base 207 perpendicular to the width direction. As illustrated in FIG. 5(D) and FIG. 6, two spacer means 224 are provided at the opposite wall 223, being interposed between the opposite wall 223 and the radiation fins 209, for defining and maintaining a space 227. The opposite wall 223 is so formed that the thickness of the space 227 decreases with distance from the cylindrical portion 221.

The peripheral wall 225 includes a pair of first side walls 225A and a pair of second side walls 225B. The pair of the first side walls 225A are spaced from each other in the width direction of the base 207 so that the radiation fins 209 are located therebetween. The pair of the second side walls 225B are spaced from each other in the lateral direction of the base 207 so that the radiation fins 209 are located therebetween. As illustrated in FIG. 5(C), extensions 229 that extend toward the base 207 are integrally provided at the pair of the first side walls 225A. The extensions 229 are of substantially a trapezoidal shape of which the width gradually decreases with distance from the first side walls 225A toward the base 207. Each of the extensions 229 is divided into three leg sections 233, 235, and 237 by two slits 229c. The two leg sections 233 and 237 are in contact with the sides 207a of the base 207. Hooks 239 constituting engagement sections to be engaged with the two step sections 207e located in the middle of the six step sections 207e in the base 207 are integrally provided at each of the central leg sections 235. Engagement of these hooks 239 with the step sections 207e causes the axial flow fan unit 105 to be mounted on the heat sink 203.

As illustrated in FIG. 6, in order to prevent winds blown onto the radiation fins 209 from the axial flow fan unit 205, indicated by arrows F1, from being directly discharged to both sides in which the pair of the second side walls 225B are positioned after passing through the space 227 between the opposite wall 223 and the heat sink 203, the pair of the first side walls 225A and the pair of second side walls 225B are so arranged as to enclose the four sides of the space 227.

The webs 219A to 219C are arranged between the fan casing 217 and the motor 211, for supporting the motor 211. The web 219A, which is one of the webs 219A to 219C, has electrical wires 231 for supplying power to the motor 211 in its inside. Referring to the web 219C in FIG. 5(A), each of the webs 219A to 219C has a motor-side joint portion 219a joined with a housing 211a of the motor 211 and a cylindrical-portion-side joint portion 219b joined with the cylindrical portion 221. Then, the webs 219A to 219C are arranged to be inclined with respect to the rotational direction of the impeller 215, as indicated by an arrow A2.

According to the heat-emitting element cooling apparatus in this embodiment, the radiation fins 209 are arranged with their portions located outside the base 207. Thus, the existence of the base 207 does not become an obstacle to the flow of air. For this reason, the cooling performance of the heat-emitting element cooling apparatus can be improved more than in the case where the base 207 receives the entire radiation fins 209. This cooling effect becomes more manifest with an increase in the flow rate of air from the axial flow fan unit 205. Further, in order to prevent winds blown onto the radiation fins 209 from the axial flow fan unit 205 from being directly discharged to both sides in which the pair of the second side walls 225B are positioned after passing through the space 227 between the opposite walls 223 and the heat sink 203, the pair of the first side walls 225A and the pair of the second side walls 225B are so arranged as to enclose the four sides of the space 227. For this reason, the cooling effect on the heat-emitting element can be further improved.

Further, the present invention is not limited to these embodiments, but variations and modifications may be made without departing from the scope of the present invention.

What is claimed is:

1. A heat-emitting element cooling apparatus comprising:
   a heat sink including a base with a heat-emitting element to be cooled mounted on a rear surface thereof and a plurality of radiation fins provided at said base; and
   a fan unit arranged on said heat sink, for blowing air along at least said radiation fins to promote heat dissipation from said radiation fins;
   wherein said heat sink is so constructed that all or part of said radiation fins are located outside a contour of said base as seen from a side where said fan unit is arranged; and
   said fan unit comprises:
      a motor;
      an impeller having a plurality of blades, for being driven for rotation by said motor;
      a fan casing having a cylindrical portion for rotatably receiving said impeller; and
      a plurality of webs arranged between said fan casing and said motor, for supporting said motor;
      said fan unit being an axial flow fan unit constructed so as to blow said air along at least said all or part of said radiation fins outside the contour of said base;
      said fan casing comprises an opposite wall located outside said cylindrical portion to face said heat sink, and a peripheral wall provided at said opposite wall and extending toward a side where said base is located; and
      said fan casing is constructed so as to define a space between said opposite wall and said heat sink, through which the air discharged from said impeller passes, and to prevent all or most of the air that has passed through said space from being directly discharged to an outside of said fan casing without passing through intervals between said radiation fins.

2. The heat-emitting element cooling apparatus as claimed in claim 1, wherein said fan casing is formed so that a thickness of said space decreases with distance from said cylindrical portion.

3. A heat-emitting element cooling apparatus comprising:
   a heat sink including a base with a heat-emitting element to be cooled mounted on a rear surface thereof and a radiation fin group comprising a plurality of radiation fin provided at said base; and
   a fan unit arranged on said heat sink, for discharging air along at least said radiation fins constituting said radiation fin group to promote heat dissipation from said radiation fins;
   wherein said base of said heat sink has a columnar shape;
   said radiation fins extend from an outer periphery of said base in a radially outward direction of said base;
   said fan unit comprises:
   a motor;
   an impeller including a blade mounting section provided at a rotor of said motor, for being driven for rotation, and a plurality of blades provided at a cylindrical outer periphery of said blade mounting section;
   a fan casing provided with a cylindrical portion for rotatably receiving said impeller and wherein said fan casing further comprises:
      an opposite wall located outside said cylindrical portion to face said heat sink; and
      a peripheral wall provided at said opposite wall and extending toward a side where said heat sink is located; and
      said fan casing is constructed so as to define a space between said opposite wall and said heat sink, through which the air discharged from said impeller passes, and to prevent all or most of the air that has passed through said space from being directly discharged to an outside of said fan casing without passing through said radiation fins;
   a plurality of webs arranged between said fan casing and said motor, for supporting said motor:
   said fan unit is an axial flow fan unit constructed so as to blow air onto said radiation fins;
   said fan unit is arranged on said heat sink such that a rotation center of said rotor is substantially aligned with a center of said base; and
   a contour of said base as seen from the rear surface thereof is defined to be located inside a contour of said impeller as seen from a rear surface of said fan unit.

4. The heat-emitting element cooling apparatus as claimed in claim 3, wherein said opposite wall is provided with a plurality of spacer means interposed between said opposite wall and said radiation fin group, for defining and maintaining said space.

5. The heat-emitting element cooling apparatus as claimed in claim 3, wherein said fan casing is formed so that a thickness of said space decreases with distance from said cylindrical portion.

6. The heat-emitting element cooling apparatus as claimed in claim 3, wherein said radiation fins constituting said radiation fin group comprises:
   two or more space-dividing radiation fins directly extending from the outer periphery of said base in said radial direction, for dividing a space surrounding said outer periphery of said base into a plurality of divided spaces; and
   a plurality of subdividing radiation fins located within said divided spaces, a part of said subdividing radiation fins respectively extending from two of said space-dividing radiation fins adjacent to each other and the remaining subdividing radiation fins respectively extending outward from the outer periphery of said base arranged between said adjacent space-dividing radiation fins so that said divided spaces are further subdivided.

7. The heat-emitting element cooling apparatus as claimed in claim 6, wherein said subdividing radiation fins located in each of said divided spaces extend substantially in parallel to one another.

8. The heat-emitting element cooling apparatus as claimed in claim 7, wherein said subdividing radiation fins located in each of said divided spaces are inclined in a direction opposite to a rotational direction of said impeller.

9. The heat-emitting element cooling apparatus as claimed in claim 7, wherein shapes of said two or more space-dividing radiation fins are defined to allow sufficient heat dissipation through said subdividing radiation fins provided at said space-dividing radiation fins.

10. The heat-emitting element cooling apparatus as claimed in claim 6, wherein respective tips of said two or more space-dividing radiation fins are integrally provided with engaged sections to be engaged with said fan casing;

said fan casing is integrally provided with two or more engagement pieces for engaging said engaged sections; and said fan unit is mounted on said heat sink by engagement of said engagement pieces with said engaged sections.

11. The heat-emitting element cooling apparatus as claimed in claim 10, wherein two of said space-dividing radiation fins are arranged at two locations 180° mutually apart in a peripheral direction of said base;

another two of said space-dividing radiation fins are arranged at different two locations 180° mutually apart in the peripheral direction of said base;

said four space-dividing radiation fins are arranged such that an angle between two of said space-dividing radiation fins containing one of said divided spaces and an angle between another two of said space-dividing radiation fins containing another one of said divided spaces are equal, said one of said divided spaces and said another one of said divided spaces being radially opposed each other;

respective tips of said four space-dividing radiation fins are integrally provided with four of said engaged sections to be engaged with said fan casing;

said fan casing is integrally provided with four engagement pieces for engaging said four engaged sections; and said fan unit is arranged on said heat sink by engagement of said four engagement pieces with said four engaged sections.

12. The heat-emitting element cooling apparatus as claimed in claim 8, wherein shapes of said two or more space-dividing radiation fins are defined to allow sufficient heat dissipation through said subdividing radiation fins provided at said space-dividing radiation fins.

13. A heat-emitting element cooling apparatus comprising:

a heat sink including a base with a heat-emitting element to be cooled mounted on a rear surface thereof and a radiation fin group comprising a plurality of radiation fins provided at said base; and a fan unit arranged on said heat sink, for discharging air along at least said radiation fins constituting said radiation fin group to Promote heat dissipation from said radiation fins;

wherein said base of said heat sink has a columnar shape, said base comprising a hollowed central section formed to be integral with said radiation fin group and including a cavity therein, and a high thermal conductor having high thermal conductivity and arranged within said cavity to allow heat transfer to said hollowed central section and having a thermal conductivity higher than that of a material employed for forming said radiation fin group and said hollowed central section;

said radiation fins extend from an outer periphery of said base in a radially outward direction of said base;

said fan unit comprises:

a motor;

an impeller including a blade mounting section provided at a rotor of said motor, for being driven for rotation, and a plurality of blades provided at a cylindrical outer periphery of said blade mounting section;

a fan casing provided with a cylindrical portion for rotatably receiving said impeller; and a plurality of webs arranged between said fan casing and said motor, for supporting said motor;

said fan unit is an axial flow fan unit constructed so as to blow air onto said radiation fins;

said fan unit is arranged on said heat sink such that a rotation center of said rotor is substantially aligned with a center of said base; and a contour of said base as seen from the rear surface thereof is defined to be located inside a contour of said impeller as seen from a rear surface of said fan unit.

14. The heat-emitting element cooling apparatus as claimed in claim 13, wherein said cavity comprises a through hole that is open in both vertical directions; and said high thermal conductor fully occupies 80–90% of a space extending from a bottom side opening to a top side opening of said through hole.

* * * * *

UNITED STATES PATENT AND TRADEMARK OFFICE
CERTIFICATE OF CORRECTION

PATENT NO. : 6,927,979 B2 Page 1 of 1
DATED : August 9, 2005
INVENTOR(S) : Watanabe et al.

It is certified that error appears in the above-identified patent and that said Letters Patent is hereby corrected as shown below:

Title page,
Item [56], References Cited, insert the following:
-- FOREIGN PATENT DOCUMENTS
EP      0 856 888 A2         8/1998 --.

Column 12,
Line 9, delete "fin" and insert -- fins --.

Column 14,
Line 12, delete "Promote" and insert -- promote --.

Signed and Sealed this

Eighth Day of November, 2005

JON W. DUDAS
*Director of the United States Patent and Trademark Office*